(12) United States Patent
Galera et al.

(10) Patent No.: US 8,072,051 B2
(45) Date of Patent: Dec. 6, 2011

(54) FOLDED LANDS AND VIAS FOR MULTICHIP SEMICONDUCTOR PACKAGES

(75) Inventors: Manolito Galera, Singapore (SG); Leocadio Alabin, Singapore (SG); In Suk Kim, Singapore (SG)

(73) Assignee: Fairchild Semiconductor Corporation, San Jose, CA (US)

( * ) Notice: Subject to any disclaimer, the term of this patent is extended or adjusted under 35 U.S.C. 154(b) by 105 days.

(21) Appl. No.: 12/560,007

(22) Filed: Sep. 15, 2009

(65) Prior Publication Data

US 2011/0062568 A1    Mar. 17, 2011

(51) Int. Cl.
*H01L 23/495* (2006.01)
*H01L 23/48* (2006.01)

(52) U.S. Cl. ........ 257/666; 257/673; 257/784; 257/778; 257/E23.047

(58) Field of Classification Search ................. 257/666, 257/777, 784, 778, E23.047
See application file for complete search history.

(56) References Cited

U.S. PATENT DOCUMENTS

| | | | | |
|---|---|---|---|---|
| 5,917,242 A * | 6/1999 | Ball | ........................... | 257/737 |
| 6,320,251 B1 * | 11/2001 | Glenn | ........................... | 257/678 |
| 6,380,624 B1 * | 4/2002 | Hung | ........................... | 257/723 |
| 6,781,243 B1 | 8/2004 | Li et al. | | |
| 6,849,949 B1 | 2/2005 | Lyu et al. | | |
| 6,951,982 B2 * | 10/2005 | Chye et al. | ........................... | 174/350 |
| 6,977,431 B1 * | 12/2005 | Oh et al. | ........................... | 257/696 |
| 7,071,545 B1 * | 7/2006 | Patel et al. | ........................... | 257/686 |
| 7,598,603 B2 * | 10/2009 | Otremba | ........................... | 257/675 |
| 7,619,303 B2 * | 11/2009 | Bayan | ........................... | 257/666 |
| 2007/0164403 A1 * | 7/2007 | Huang et al. | ........................... | 257/666 |
| 2009/0127676 A1 * | 5/2009 | Gomez | ........................... | 257/666 |
| 2009/0166821 A1 * | 7/2009 | Camacho et al. | ........................... | 257/667 |

* cited by examiner

*Primary Examiner* — Nitin Parekh
(74) *Attorney, Agent, or Firm* — Kirton & McConkie; Kenneth E. Horton (57) ABSTRACT

Semiconductor packages and methods for making and using the same are described. The semiconductor packages contain a lead frame that has been folded to create folded leads that form a customized array of land pads and vias. The lead frame contains both longer folded lead and shorter folded leads. The longer leads can be folded so that an upper part of the longer leads form vias, the lower part forms part of a land pad array, and a substantially flat part that is connected to a first die containing an IC. The shorter leads can be folded so that a lower part forms part of a land pad array and the short leads are connected to a second die containing in IC. The folded leads can be routed according to the requirements of each specific IC die to which they are connected and therefore can support multiple dies in the semiconductor package. Other embodiments are also described.

24 Claims, 9 Drawing Sheets

FOLDED LANDS AND VIAS FOR MULTICHIP SEMICONDUCTOR PACKAGES

FIELD

This application relates generally to semiconductor devices and methods for making such devices. More specifically, this application describes semiconductor packages that contain a lead frame with folded leads that form a customized array of lands and routing leads and methods for making such packages.

BACKGROUND

Semiconductor packages are well known in the art. Often, these packages may include one or more semiconductor devices, such as an integrated circuit ("IC") die or chip, which may be connected to a die pad that is centrally formed in a lead frame which contain a series of leads. In some cases, bond wires electrically connect the IC die to a series of terminals that serve as an electrical connection to an external device, such as a printed circuit board ("PCB"). An encapsulating material can be used to cover the bond wires, the IC die, the terminals, and/or other components of the semiconductor device to form the exterior of the semiconductor package. A portion of the terminals and possibly a portion of the die pad may be externally exposed from the encapsulating material. In this manner, the die may be protected from environmental hazards—such as moisture, contaminants, corrosion, and mechanical shock—while being electrically and mechanically connected to an intended device that is external to the semiconductor package.

After it has been formed, the semiconductor package is often used in an ever growing variety of electronic applications, such as disk drives, USB controllers, portable computer devices, cellular phones, and so forth. Depending on the die and the electronic application, the semiconductor package may be highly miniaturized and may need to be as small as possible.

SUMMARY

This application relates to semiconductor packages and methods for making and using the same. The semiconductor packages contain a lead frame that has been folded to create folded leads that form a customized array of land pads and vias. The lead frame contains both longer folded lead and shorter folded leads. The longer leads can be folded so that an upper part of the longer leads form vias, the lower part forms part of a land pad array, and a substantially flat part that is connected to a first die containing an IC. The shorter leads can be folded so that a lower part forms part of a land pad array and the short leads are connected to a second die containing in IC. The folded leads can be routed according to the requirements of each specific IC die to which they are connected and therefore can support multiple dies in the semiconductor package.

BRIEF DESCRIPTION OF THE DRAWINGS

The following description can be better understood in light of the Figures, in which.

The Figures illustrate specific aspects of the semiconductor packages that contain a folded lead frame and methods for making such packages. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the semiconductor devices and associated methods of using the devices can be implemented and used without employing these specific details. Indeed, the devices and associated methods can be placed into practice by modifying the illustrated devices and associated methods and can be used in conjunction with any other apparatus and techniques conventionally used in the industry. For example, while the description below focuses on methods for making for semiconductor devices in the IC industry, it could be used for and applied to other electronic devices like optoelectronic devices, solar cells, MEMS structures, lighting controls, power supplies, and amplifiers.

Some embodiments of the semiconductor packages and methods for making such packages are shown in the FIGS. 1-10. In these embodiments, the methods for making the semiconductor packages being by providing a lead frame 10. The lead frame 10 can be any lead frame known in the art. In some embodiments, the lead frame can be manufactured by any known process, such as a stamping or etching process. In other embodiments, the lead frame 10 can be manufactured by a stamping process since it simpler, easier, and cheaper than using an etching process.

The lead frame 10 can have any size and thickness that is needed for the completed semiconductor package. Thus, the size and thickness of the lead frame 10 will depend on the integrated circuit (IC) die (or dies) that will be contained in final semiconductor package. The lead frame 10 can comprise any conductive metal or metal alloy known in the art, including Cu, Ni—Pd, Ni—Pd—Au, Ni—Pd—Au/Ag, or combinations thereof. In some embodiments, the lead frame comprises Cu or a Cu alloy.

Figure 1:
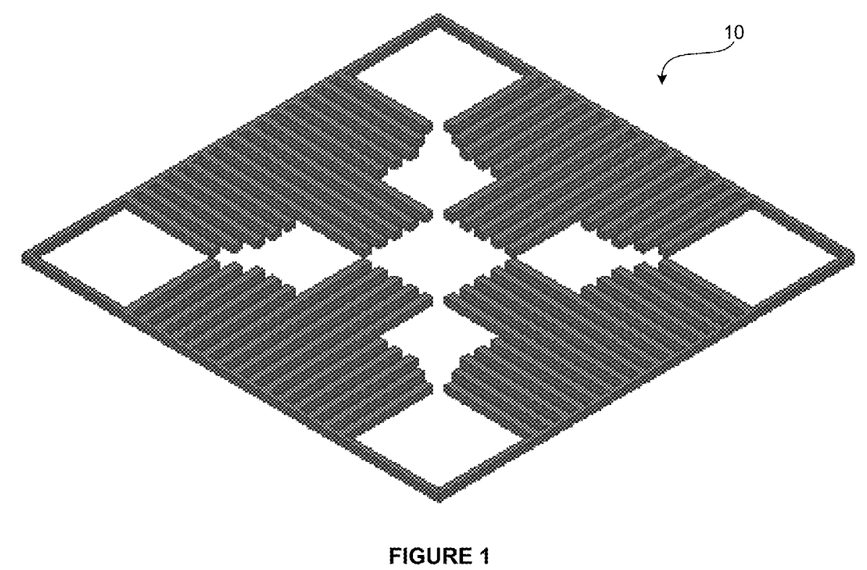
FIG. 1 shows some embodiments of a method for making semiconductor packages containing a lead frame.

The lead frame 10 is in a substantially flat configuration as shown in FIG. 1. The lead frame 10 can then modified so that it has a folded configuration with a bottom part of the lead frame that forms land pads (or lands) for the final semiconductor package and an upper part that forms via connections (or vias). This folding process can be performed using any known processes, including stamping.

Figure 2:
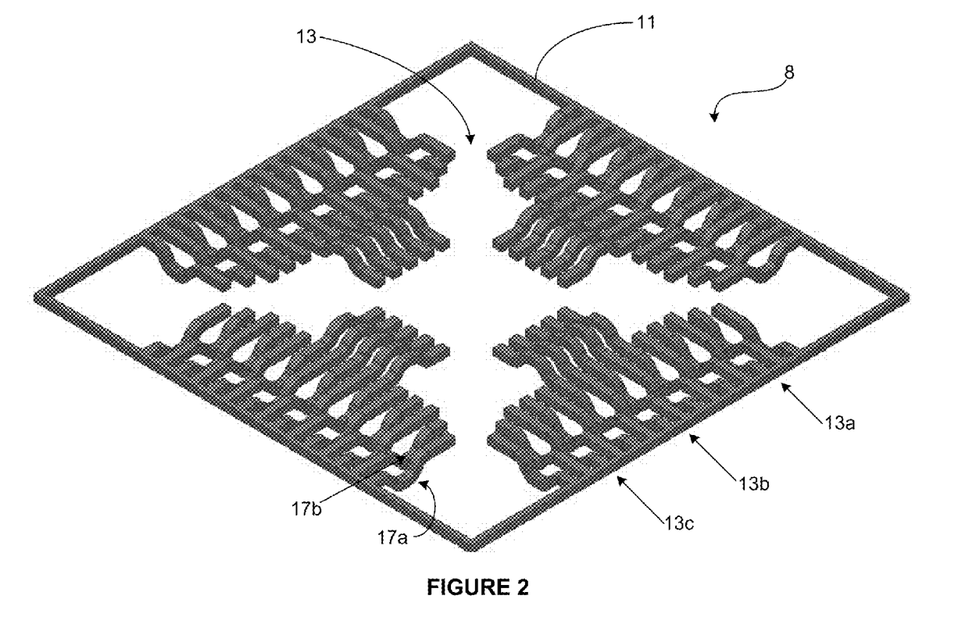
FIG. 2 depicts some embodiments of a method for making semiconductor packages containing a folded lead frame.

In some embodiments, the folding process creates a folded lead frame 8, as shown in FIG. 2, wherein the outer portion retains its substantially rectangular shape but the inner portion has been folded. In other embodiments, rather than making a lead frame 10 and then folding it to create a folded lead frame 8, the folded lead frame is initially manufactured in that configuration, thereby eliminating the folding step.

In some embodiments, the folded lead frame can have the configuration illustrated in FIG. 2. In these embodiments, the outer portion 11 of the folded lead frame 8 is substantially rectangular and the inner portion 13 of the folded lead frame 8 contains first, shorter sections 13a (with shorter leads) on either side of a second, longer section 13b (with longer leads). In other embodiments, each side of the folded lead frame 8 need only have a single longer section and a single shorter section. In yet other embodiments, the folded lead frame 8 can be configured to have just a substantially uniform length along a given side (i.e., from one lead to the next). In still other embodiments, the folded lead frame 8 can be configured to have just a non-uniform length along a given side (i.e., a non uniform length from one lead to the next). The actual lead length and configuration in any embodiment will vary depending on the desired die layout and package pin assignment and/or the interconnect process (wirebonding or bumped for flipchip connection). For example, the lead length can vary to fit the selected die and the interconnect process such that longer leads can be used in a flipchip connection of a small die to the leadframe, while shorter leads could be used in a wirebond connection. In yet other embodiments, the folded lead frame 8 need not have a rectangular shape, but can have any geometrical shape known in the art, such as chamfered corner square or chamfered corner rectangle.

Figure 3:
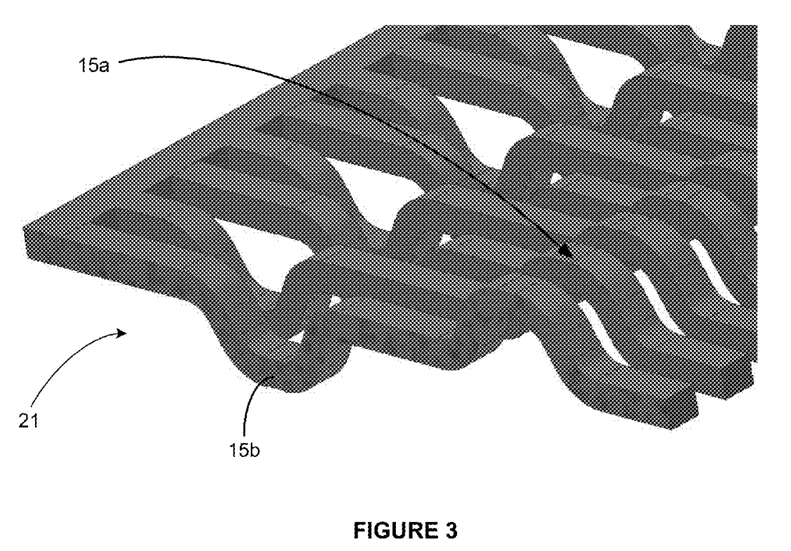
FIG. 3 depicts some embodiments of a method for making semiconductor packages containing a folded lead frame with lands and vias.

A close-up of the folded lead frame 8 is shown in FIG. 3. In the embodiments depicted in FIGS. 2 and 3, the longer leads 13b of the inner portion 13 of the lead frame have been folded so that a first portion 15a (closer to the middle of the folded lead frame 8) is raised and a second portion 15b (closer to the outer portion 11) is lowered from its original position shown in FIG. 1. The end of the longer leads 13b (near the middle of the lead frame) remains in a substantially flat configuration.

As for the shorter leads 13a of the folded lead frame 8, all of them have been folded so that a part of the shorter leads 13a have been lowered from its original position shown in FIG. 1. In the embodiments shown in FIG. 2, the shorter leads are folded in an alternating configuration 21 so that every other lead has a folded part (including the longer sections) in about the same distance from the outer portion 11. Thus, the inner portion 13 of the lead frame 8 contains alternating series of lower folded parts where first folded parts 17a are closer to the outer portion while second folded parts 17b are located closer to the middle of the lead frame 8. In some instances, this alternating configuration can be used to give enough distance between the lands (on the leads) because of the limited capability of the board mounting process. But an in-line configuration could be used as the board mounting capability improves.

With such a configuration of longer and shorter leads, an array of land pads can be formed at the bottom of the package and an array of vias can be formed on the top of the package. As shown in FIG. 3, the first portion 15a of the longer leads (which has been raised) forms a via for the semiconductor package while the second portion 15b (along with the first folded part 17a and second folded part 17b from the shorter leads) form land pads (or lands).

The overall thickness of the folded configuration of the leadframe (from the land pad to the vias) will depend on the desired thickness of the overall semiconductor package and die thickness. In some embodiments, the overall thickness can range from about 600 µm to about 1000 µm. The thickness of the upper part of the folded configuration of the leadframe (from the normal flat configuration to the vias) will depend on the size of the upper die (as described below) and the interconnect height. In some embodiments, the upper thickness can range from about 200 µm to about 500 µm. The thickness of the lower part of the folded configuration of the leadframe (from the normal flat configuration to the land pad) will depend on the size of the lower die (as described below) and the interconnect height. In some embodiments, the lower thickness of the folded leads can range from about 200 µm to about 500 µm. The lengths of the leads will depend on the interconnect layout and whether the leads will contain both a land and a via. Leads that contain both a land and a via should be longer to meet the folding process requirement.

Figure 4:
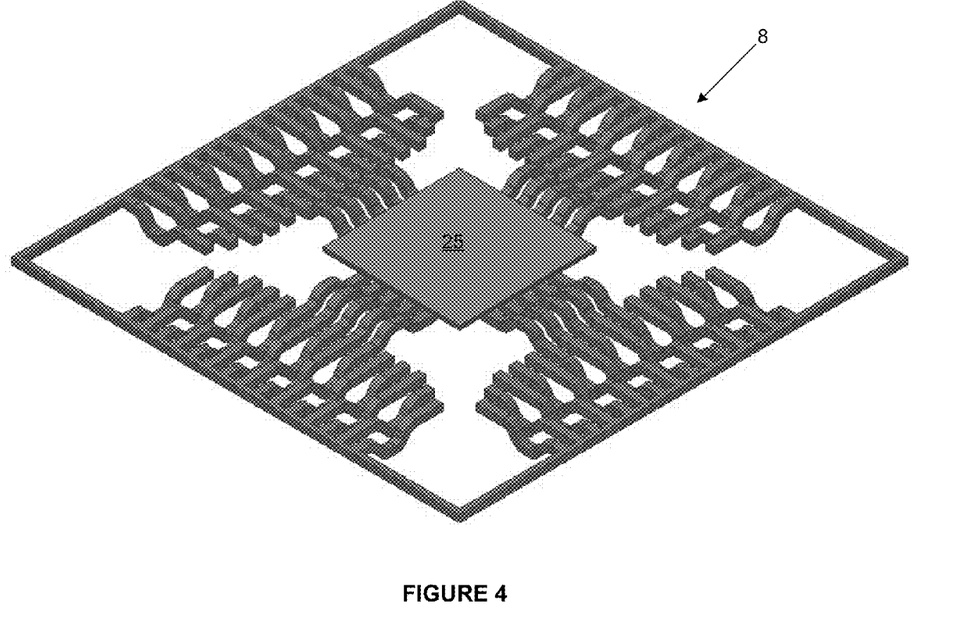
FIG. 4 depicts some embodiments of a method for making semiconductor packages containing a first die connected to longer leads of the folded lead frame.

Next, as shown in FIG. 4, a first semiconductor die (or IC die) 25 is attached to the innermost part of the longer leads which have not been folded. The die 25 may be made of any suitable semiconductor material. Some non-limiting examples of such materials may include silicon, polysilicon, gallium arsenide, silicon carbide, gallium nitride, silicon and germanium, and the like.

The die 25 can contain any number of IC devices. The IC device may be any known integrated circuit (including any discrete device) in the art. Some non-limiting examples of these devices may include logic or digital IC, linear regulators, audio power amplifiers, LDO, driver IC, diodes, and/or transistors, including zener diodes, schottky diodes, small signal diodes, bipolar junction transistors ("BJT"), metal-oxide-semiconductor field-effect transistors ("MOSFET"), insulated-gate-bipolar transistors ("IGBT"), and insulated-gate field-effect transistors ("IGFET").

Any known flipchip process can be used to attach the first die 25 to the folded lead frame 8. In these embodiments, the IC device(s) on the first die 25 can be provided with a bond pad as known in the art. In some embodiments, the bond pads can be provided in those areas that overlay the IC device(s). The bond pads can be formed in the desired location by any process known in the art (such as a redistribution method) and can be made of any known solderable material, including Au, Cu, Ag, Ti, Ni, Sn, W, Ni, or combinations thereof.

An array of solder bumps (or pillars) can then be provided on the bond pads. The bumps can be made of conductive material such as Ag, Sn, Pb, Cu, Sb, Au or combinations thereof. The bumps can be provided on the bond pads through any process known in the art, including electroless plating, ball drop, or printing. Then, the die 25 is flipped and placed on the folded lead frame 8 so the bond pad on the front side of the first die (through the bumps) is attached to the ends of the longer leads, as shown in FIG. 4. The result of this process leaves the back side of the first die facing upwards.

Figure 5:
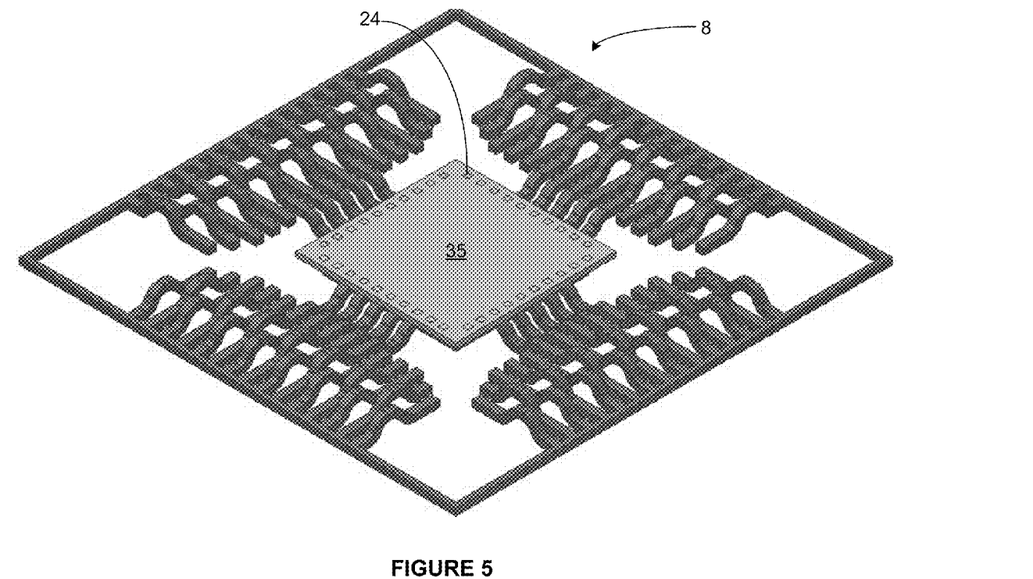
FIG. 5 depicts some embodiments of a method for making semiconductor packages containing a second die.
Figure 6:
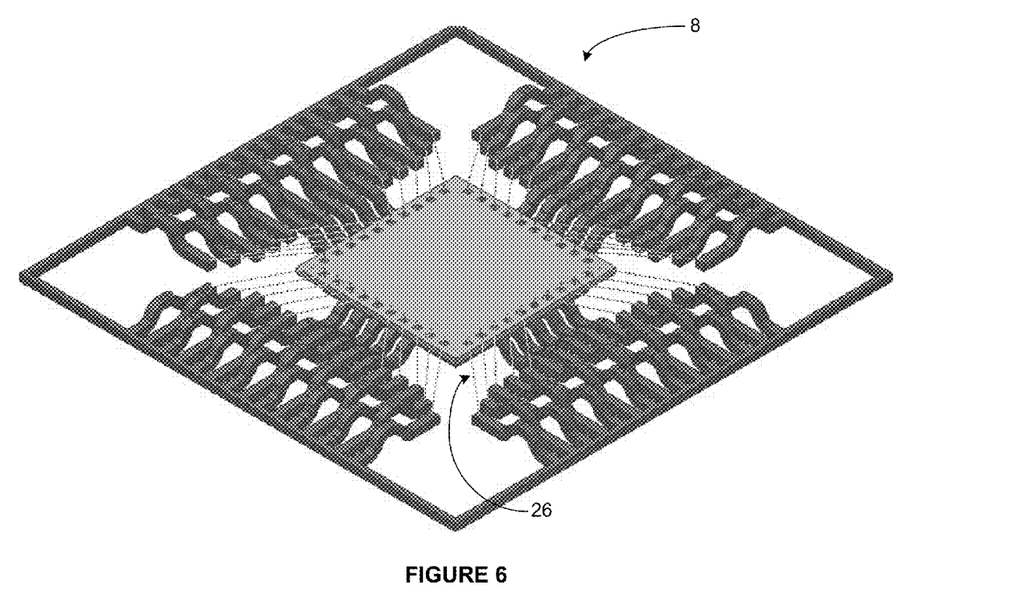
FIG. 6 depicts some embodiments of a method for making semiconductor packages containing a second die wirebonded to shorter leads of the folded lead frame.

Next, as shown in FIG. 5, a second die 35 can be attached to the first die. The backside of the second die 35 is attached to the backside of the first die 25, thereby leaving the front side of the second die exposed, as shown in FIG. 5. The second die 35 can comprise contact pads 24 (as shown in FIG. 5) which are available for electrical connection to the shorter leads of the folded lead frame 8. Typically, those contact pads 24 are located in the periphery of the second die 35. Those contact pads can then be electrically connected to one or more of the shorter leads in any known manner, including using any wire bonding process. For example, FIG. 6 shows that the contact pads 24 can be electrically connected to the leads of the shorter leads by any known wire bonding process. In such instances, the bonding wires 26 may be made of any wire bonding material and have any suitable size. Some non-limiting examples of wire bonding materials may include Au, Cu, and combinations thereof other. In some embodiments, with a change in the routing and layout configuration of the folded lead frame and where the second die is large enough, a flip chip process can be used in place of the wire bonding process.

Figure 7:
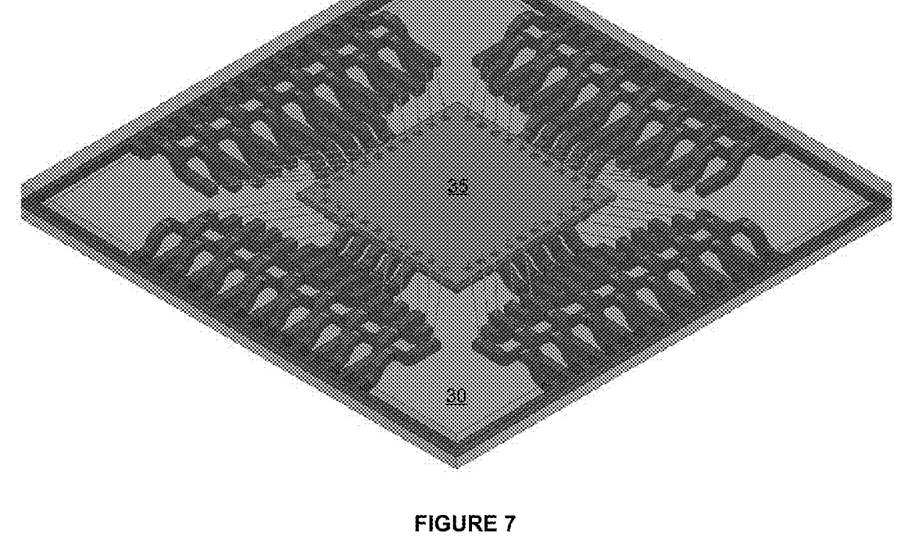
FIG. 7 depicts some embodiments of a method for making semiconductor packages with a molding.

The folded lead frame 8, the first die 25, second die 35, and the bond wires 26 can then be encapsulated in any molding material 30 known in the art, as shown in FIG. 7. In some embodiments, the molding material 30 can comprise an epoxy molding compound, a thermoset resin, a thermoplastic material, or potting material. In other embodiments, the molding material comprises an epoxy molding compound. In FIG. 7, the molding material 30 is shown in phantom to better illustrate the internal components of semiconductor package. The molding material made be formed using any encapsulation process known in the art.

Figure 8A:
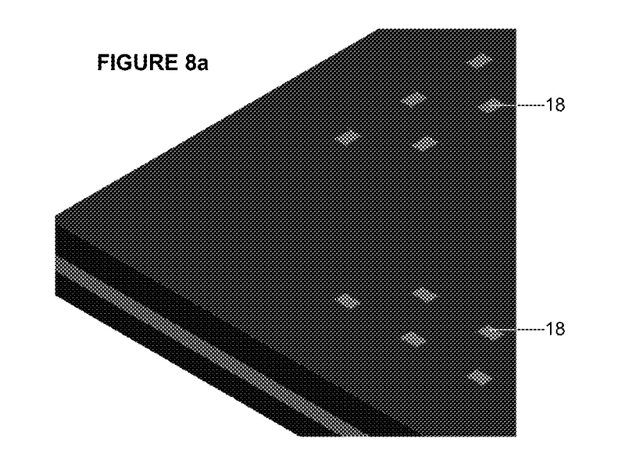
FIGS. 8a and 8b show some embodiments of a method for making semiconductor packages showing the exposed metal areas of land pads and vias.
Figure 8B:
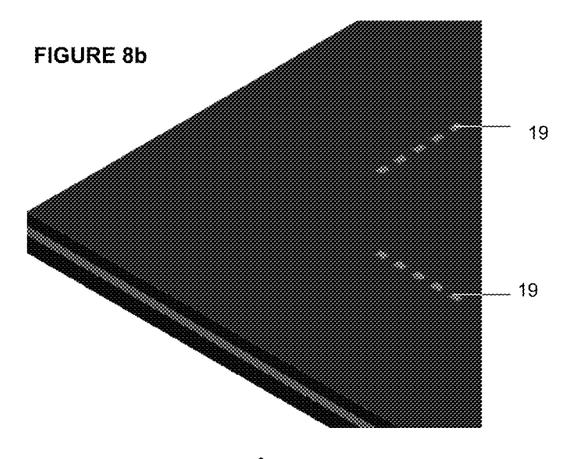

The molding material 30 does not completely encapsulate the folded lead frame 8. The lower portions and upper portions of the folded lead frame remain exposed, as shown in FIG. 7. The lower portions of the folded lead frame that remain exposed serve as land pads 18, as shown in FIG. 8a. The upper portions of the folded lead frame that remain exposed serve as vias 19, as shown in FIG. 8b.

The lands 18 have an array on the lower surface of the semiconductor package and are configured for the external electronic device to which the semiconductor package will be attached (such as a printed circuit board). The lands 18 can have any configuration known in the art consistent with their operation as terminals for the semiconductor package. Thus, in the illustrated embodiments, the lands 18 are given a substantially rectangular configuration with a size ranging from about 0.10 mm to about 0.20 mm. In other embodiments, though, the lands 18 can have a round or other suitable geometrical shape.

The vias 19 have an array on the upper surface of the semiconductor package and are configured for another semiconductor package to be attached or stacked thereon. The vias can have any configuration that will connect to the other semiconductor package. Thus, in the illustrated embodiments, the vias are given a substantially rectangular configuration with a size ranging from about 0.10 mm to about 0.20 mm. In other embodiments, though, the vias 19 can have a round or other suitable geometrical shape.

Figure 9A:
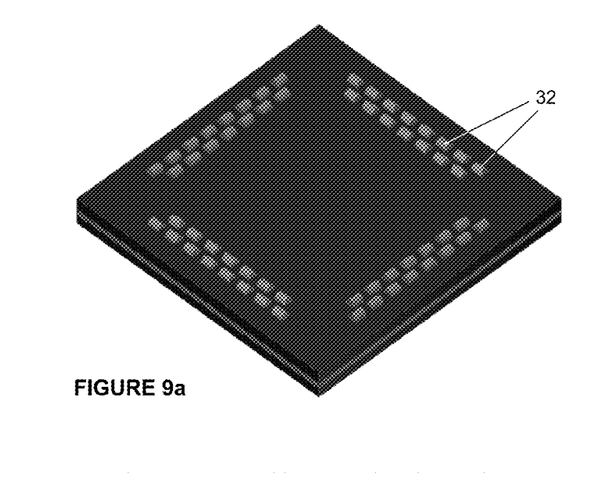
FIGS. 9a and 9b show some embodiments of a method for making semiconductor packages showing the exposed metal areas with plating.
Figure 9B:
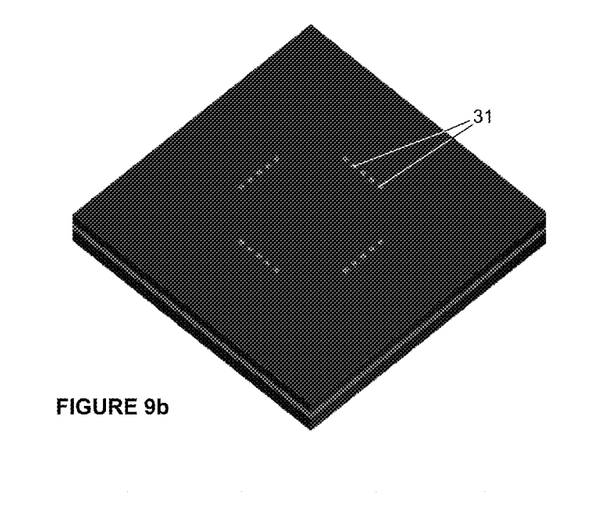
Figure 10:
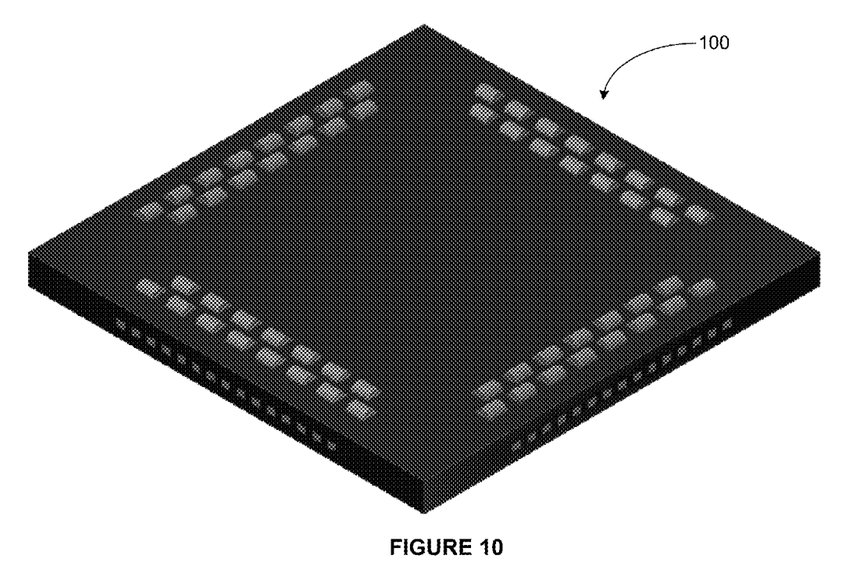
FIG. 10 depicts some embodiments of a method for making semiconductor packages that have been singulated and tested.

Optionally, the lands 18 and/or the vias 19 can be plated and/or can be provided with a solder bump so that the electrical connection to the PCB or the stacked semiconductor package can be improved. The lands 18 and/or the vias 19 can be provided with solder bumps using any bumping process known in the art. For example, the bumping process can provide solder bumps 32 on the lands 18, as shown in FIG. 9a. The plating process can plate the lands 18 and/or the vias 19 with any desired conductive material (such as Sn, SnPb, Au, Cu, or combinations thereof with any desired thickness) until a plate 31 is formed, for example, via 19 as shown in FIG. 9b.

The molded semiconductor package (as shown in FIG. 7) can then be singulated. The singulation of the molded semiconductor package can be carried out using any process known in the art, including a saw singulation process. Then, the singulated semiconductor packages may be electrically tested, taped, and reeled using any processes known in the art to form a completed semiconductor package 100. The semiconductor packages can then be stacked and/or can then be connected to a printed circuit board (PCB) using the lands that are optionally plated/bumped and used in any electronic device known in the art such as portable computers, disk drives, USB controllers, portable audio devices, or any other portable/ultraportable electronic devices.

Figure 11:
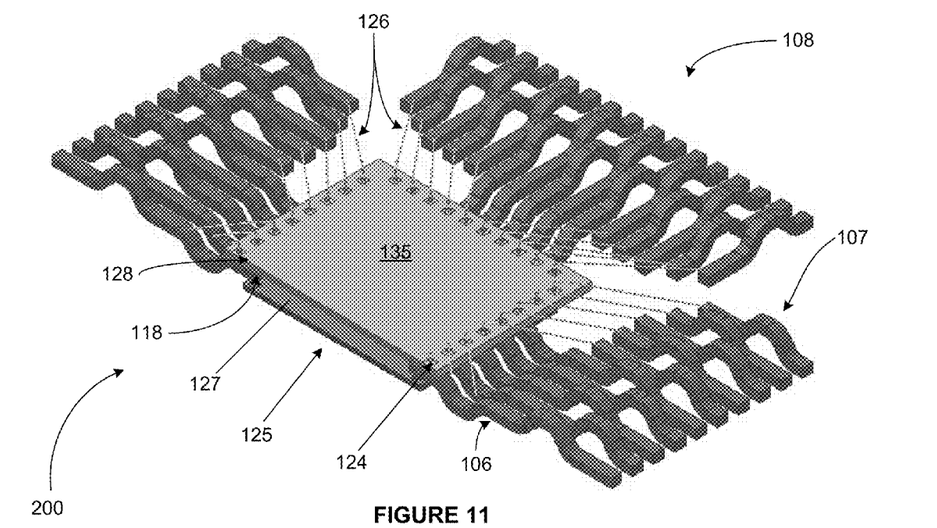
FIGS. 11-12 depicts top and side views of other embodiments for making semiconductor packages with first and second dies.
Figure 12:
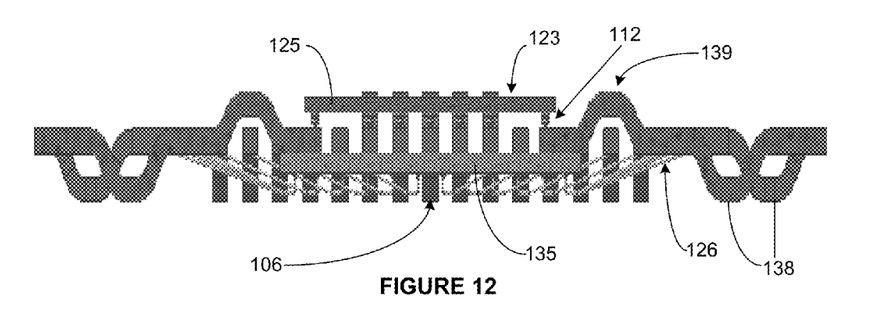

In other embodiments, the first die and the second die can be configured differently within the semiconductor package so that they are not in a back-to-back configuration without using a different folded lead frame, even through a different configuration could be used. These embodiments are depicted in FIG. 11, with a side view in FIG. 12. In these embodiments, the back side 123 of the first die 125 is oriented towards the lands 138 on the bottom of the package. The front side 121 of the first die 125 is connected to a first side of the longer leads 106 of the folded leadframe 108 via solder bumps 112. The back side 118 of the second die 135 is attached to the opposite side of the longer leads by a conductive or non-conductive film. The front side 128 of the second die 135 contains the contact pads 124 that are wire bonded by wired bonds 126 to the shorter leads 107. In this semiconductor package 200, the folded leadframe 108 still forms an array of land pads 138 on the bottom of the package and an array of vias 139 on the top of the package.

Figure 13:
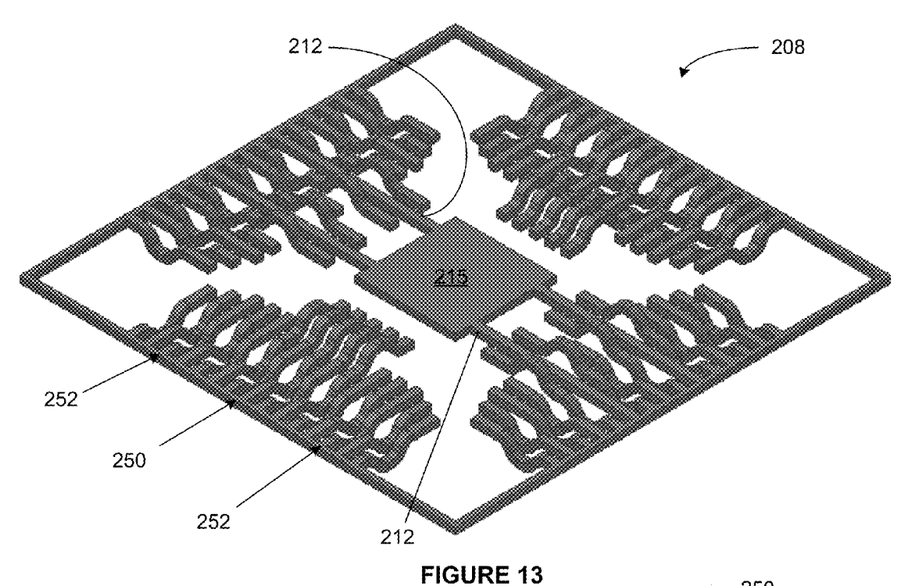
FIGS. 13-14 show yet other embodiments of a method for making semiconductor packages containing a folded lead frame with a die attach pad.
Figure 14:
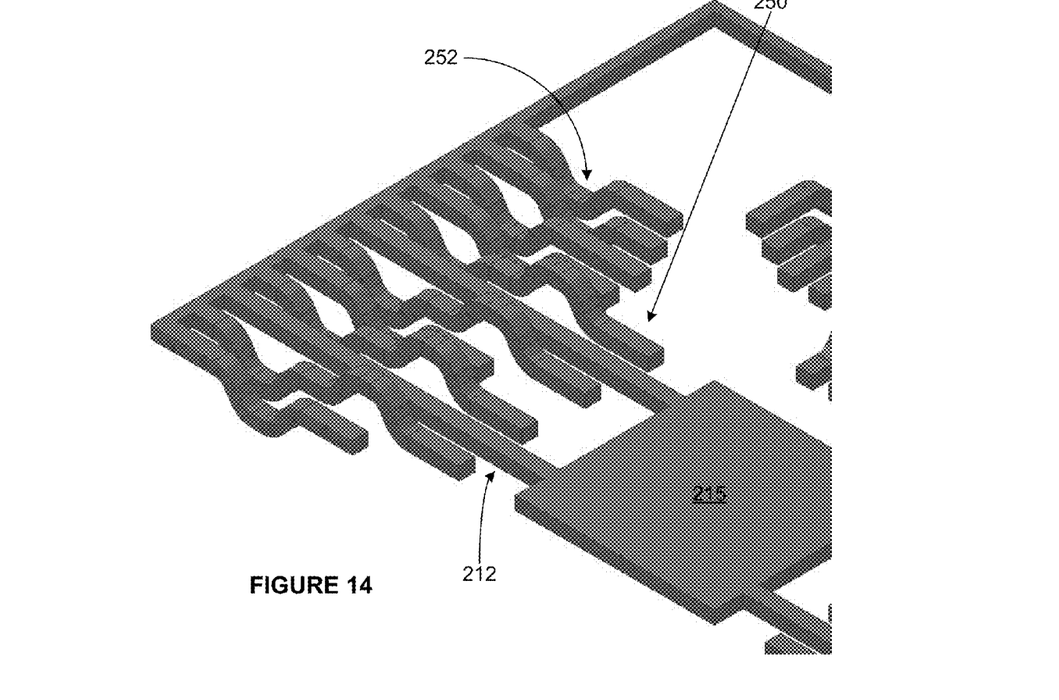

In yet other embodiments, the folded lead frame can contain a die attach pad (DAP). In some configurations, the DAP is located near the center of the folded lead frame. An example of these configurations is illustrated in FIGS. 13-14. As shown in the side view of FIG. 15, the folded leadframe 208 contains the upper portions 210 and lower portions 206 which will serve as the land pads and the via.

Figure 15:
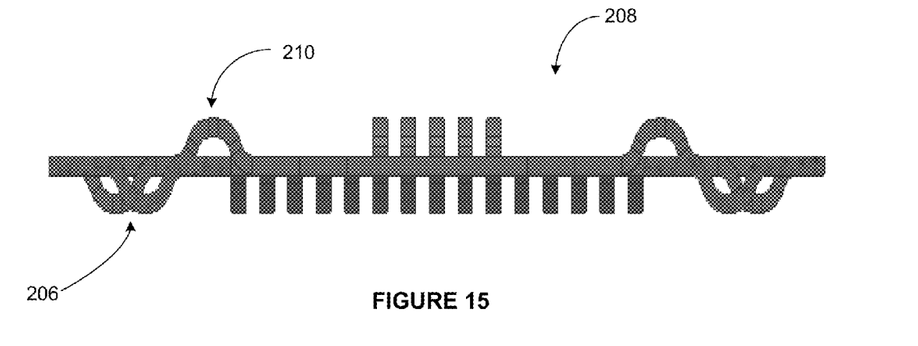
FIG. 15 show a side view of the other embodiments of a method for making semiconductor packages containing a folded lead frame with a die attach pad.

The folded leadframe 208 contains a DAP 215 near the center that is connected to straight longer leads 212 on opposite sides of the folded leadframe 208 which have not been folded. In some instances, the DAP 215 can be connected to longer leads from 3 or even 4 sides of the leadframe. Since they are not folded, the straight longer leads accordingly do not form any part of the land or vias array of the completed semiconductor package. The folded leadframe 208 can be manufactured in the folded configuration containing the DAP or can be manufactured in a flat configuration with a DAP and then folded using any of the processes described above.

As depicted in FIG. 13-15, the folded leadframe 208 contains DAP 215 on which the first and second dies of the semiconductor package can be located. Any DAP known in the art can be used, such as one that is made of an electrically and thermally conductive material, including Cu, Au, Ni, Pd, and combinations thereof. In some embodiments, the DAP 215 comprises the material as the leadframe, such a Cu or a Cu alloy. Thus, the DAP can also serve as a heat sink for the heat generated by the semiconductor devices during operation through the sides of the semiconductor package. The DAP 215 can be configured with any shape and size consistent with its use in the semiconductor package. The DAP 215 can have any thickness that provides the needed support for the device.

Figure 16:
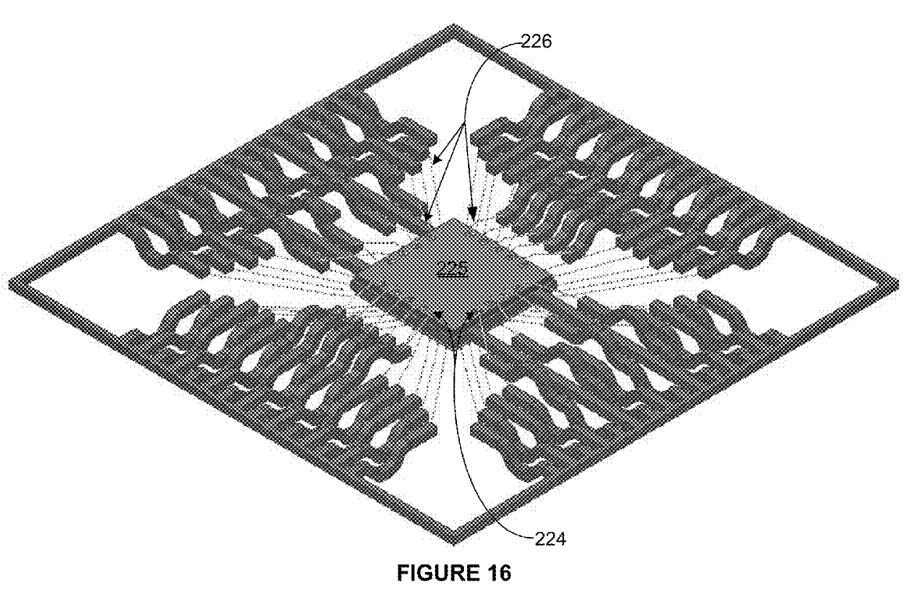
FIGS. 16-17 show top and bottom view of the other embodiments of a method for making semiconductor packages containing a folded lead frame with multiple dies.
Figure 17:
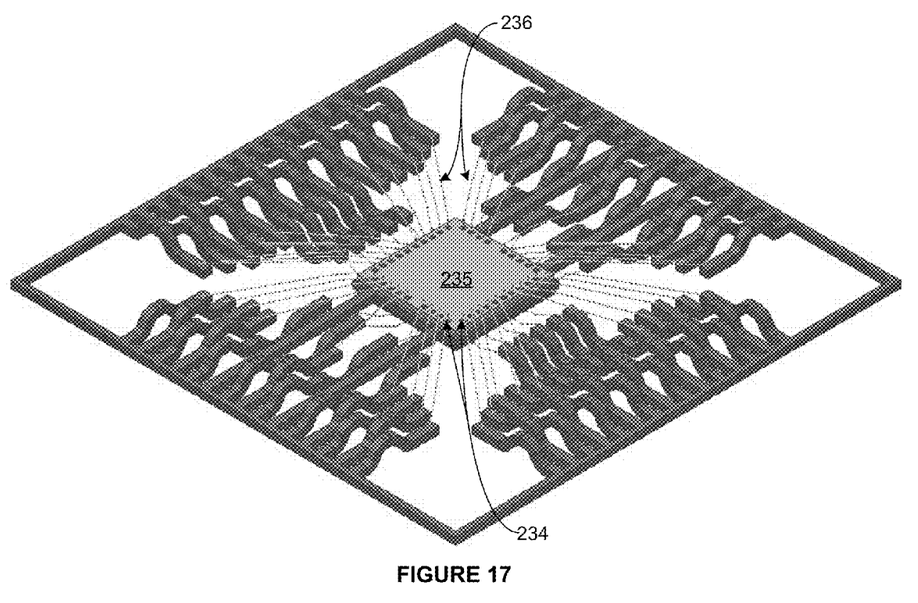

In some embodiments, the DAP 215 has the shape illustrated in the FIGS. 13-15 since it contains a pad to which the back side of a first die 225 and the back side of a second die 235 is attached by a conductive or non-conductive film, as shown in FIG. 16-17. The front side of the first die 225 contains contact pads 224 which can be wire bonded by wire bonds 226 to the longer leads 250 as shown in FIG. 16. The front side of the second die 235 also contains contact pads 234 which can be wire bonded by wired bonds 236 to the shorter leads 252 as shown in FIG. 17.

Figure 18:
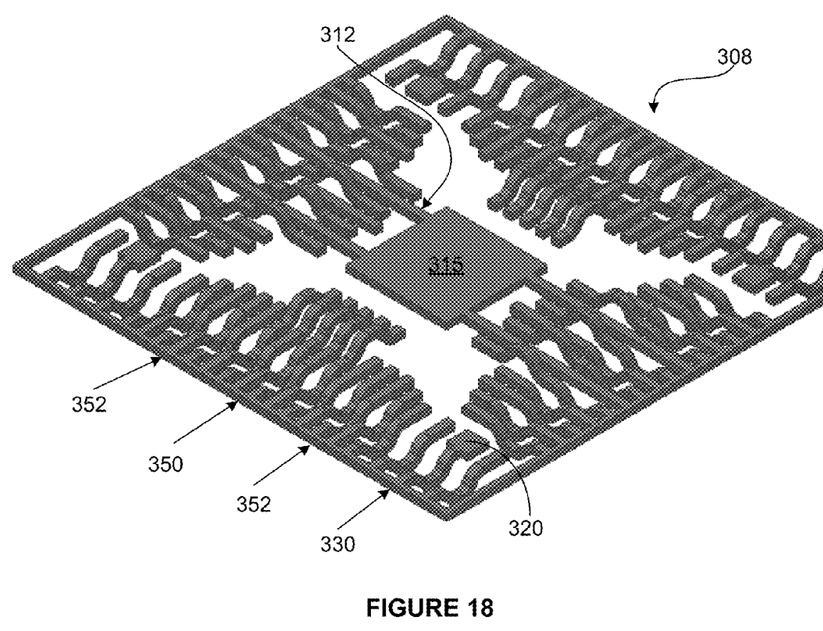
FIGS. 18-19 depicts some embodiments of a method for making semiconductor packages containing multiple die attach pads.

In other configurations, a first DAP can be located near the center of the folded lead frame and a second (or third, fourth, etc.) DAP can be located in another location. An example of these configurations is illustrated in FIG. 18, with a close-up shown in FIG. 19. As shown in these two Figures, the folded leadframe 308 contains the upper and lower portions which will serve as the land pads and the vias, as well as the longer leads 350 and shorter leads 352. In yet other configurations, the DAP (and accompanying die) located in the center can be elimination and a DAP (and the accompanying die) can be located in this other location.

Figure 19:
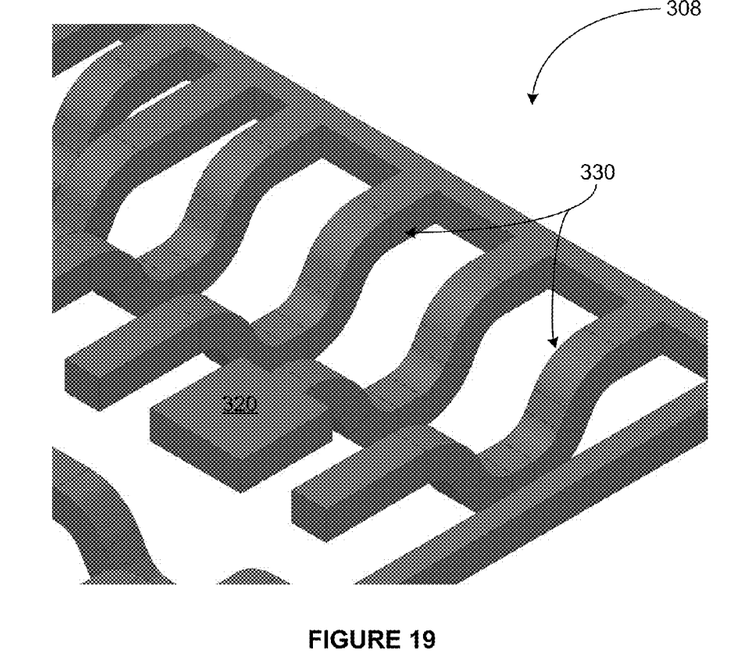

The folded leadframe 308 contains a DAP 315 near the center that is connected to non-folded leads 312 on opposite sides of the folded leadframe 308 which have not been folded. In some instances, the DAP 315 can even be connected to such non-folded leads 312 from 3 or even 4 sides of the leadframe. Since they are not folded, the non-folded leads 312 accordingly do not form any of the lands or the vias of the completed semiconductor package. The folded leadframe 308 can be manufactured in the folded configuration containing the DAP or can be manufactured in a flat configuration with a DAP and then folded using any of the processes described above.

As depicted in FIGS. 18-19, the folded lead frame 308 also contains a second DAP 320 that is located near the corner of the lead frame. In other embodiments, the second DAP can be located in other non-centered locations that have sufficient room for the second DAP. The second DAP 320 can be made of the same electrically and thermally conductive material as the first DAP, the lead frame, or a different material. The second DAP 320 can be configured with any shape and size consistent with its use in the semiconductor package. In the embodiments illustrated in FIGS. 18-19, the DAP 320 is made smaller than the first DAP 315 since the second DAP will be used to support a smaller IC, or such as a discrete or passive device, whereas the first DAP 315 will be used to support a larger discrete or IC device such as amplifiers, regulators, rectifiers, linear IC, digital IC, and so forth. The second DAP 320 is located near a third type of leads 330 (typically smaller than shorter leads 352) to which the discrete or passive device can be connected by wire bonding (not shown).

The completed semiconductor packages above contain only a single folded lead frame The folded leads of the lead frame can be routed and customized for a wide variety of land and via configurations. This allows the completed semiconductor package to be configured with many different sizes and shapes. At the same time, the folded leads can be customized for different sizes of dies and different IC devices contained in the dies.

In some embodiments, the packages can be configured to contain more than two dies. In these embodiments, the packages could contain both a non-DAP folded leadframe (containing at least one die) in combination with a DAP folded leadframe (containing at least two die) as described above. Alternatively, the packages could contain both a non-DAP folded leadframe (containing two die) in combination with a DAP folded leadframe (containing at least one die) as described above.

The semiconductor packages described above have several features. First, they are a low cost solution for manufacturing multi-chip, stackable semiconductor packages. Second, they do not require any dummy or sacrificial substrates (or similar films) to hold the land pattern during manufacturing, do not require any pre-molding processes, and do not require any back-etching process to form the land array pattern of the package. Third, there is no laser drilling or via filling process need to form the vias, yet at the same time the manufacturing process uses standard assembly methods to reduce the manufacturing cost. Fourth, the lead frame design does not need any half-etching process that is often conventionally used to make the leadless package or package wherein the lands are flushed to the molded body, which enables the semiconductor package to have adequate locking features and also allows a stamped lead frame to be used instead of the more expensive etched lead frame. Fifth, the land pad-via-lead interconnection is made of a single piece and needs no joining process during its manufacturing. Thus, this design is more robust than other conventional designs which involve joining processes such as those which need reflow, electroless plating, etc.

In some embodiments, the application relates to a method for making a semiconductor package by providing a single, folded lead frame having folded leads with an upper portion forming a via array and a lower portion forming a land pad array; providing a first die containing an integrated circuit connected to the leads; providing a second die containing an integrated circuit connected to the leads by wire bonds; and providing a molding material encapsulating the first and second dies, the wire bonds, and the folded leads except for the portions of the folded leads forming the lands and the via.

In other embodiments, the application relates to a method for making semiconductor package by providing a single, folded lead frame having longer folded leads and shorter folded leads, the longer folded leads having a substantially flat portion near the center of the lead frame, an upper portion forming part of a via array, and a lower portion forming part of a land pad array, the shorter folded leads having a lower portion forming part of the land pad array; providing a first die containing an integrated circuit flip-chipped to the substantially flat portion of the longer leads; providing a second die containing an integrated circuit connected to the shorter leads by wire bonds; and providing a molding material encapsulating the first and second dies, the wire bonds, and the folded leads except for the portions of the folded leads forming the lands and the via.

In yet other embodiments, the application relates to a method for making semiconductor package by providing a single, folded lead frame having folded leads with an upper portion forming a via array, a lower portion forming a land pad array, and a die attach pad; providing a first die containing an integrated circuit attached to the first side of die attach pad and connected to the longer leads by wire bonds; providing a second die containing an integrated circuit attached to the second side of die attach pad and connected to the shorter leads by wire bonds; and providing a molding material encapsulating the first and second dies, the wire bonds, and the folded leads except for the portions of the folded leads forming the lands and the via.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A semiconductor package, comprising:
    a single, folded lead frame having folded leads with an upper portion forming a via-shaped array and a lower portion forming a land pad array;
    a first die containing an integrated circuit connected to the respective leads by bumps;
    a second die containing an integrated circuit connected to the respective leads by wire bonds; and
    a molding material encapsulating the first and second dies, the wire bonds, and the folded leads except for the portions of the folded leads forming the lands and the via-shaped array.

2. The semiconductor package of claim 1, wherein the land pad array comprises terminals for connecting the package to an external electronic device.

3. The semiconductor package of claim 1, wherein the via-shaped array comprises terminals for connecting the package to a different semiconductor package stacked thereon.

4. The semiconductor package of claim 1, the folded leads further comprising a longer folded lead having a substantially flat portion near the center of the lead frame, an upper portion forming part of the via-shaped array, and a lower portion forming part of the land pad array.

5. The semiconductor package of claim 4, the folded leads further comprising a shorter folded lead having a lower portion forming part of the land pad array.

6. The semiconductor package of claim 5, wherein the first die is flip-chipped onto the substantially flat portion of the longer lead.

7. The semiconductor package of claim 6, wherein the second die is connected to the shorter lead by the wire bonds.

8. The semiconductor package of claim 7, wherein the back side of the first die is connected to the back side of the second die.

9. The semiconductor package of claim 4, wherein the front of the first die is flip-chipped onto the bottom of substantially flat portion of the longer lead, the back side of the second die is attached to the top of the substantially flat portion of the longer lead, and front of the second die is connected to the shorter lead by the wire bonds.

10. The semiconductor package of claim 1, wherein the thickness of the folded lead frame ranges from about 600 µm to about 1000 µm.

11. A semiconductor package, comprising:
    a single, folded lead frame having longer folded leads and shorter folded leads, the longer folded leads having a substantially flat portion near the center of the lead frame, an upper portion forming part of a via-shaped array, and a lower portion forming part of a land pad array, the shorter folded leads having a lower portion forming part of the land pad array;
    a first die containing an integrated circuit flip-chipped to the substantially flat portion of the longer leads;
    a second die containing an integrated circuit connected to the shorter leads by wire bonds; and
    a molding material encapsulating the first and second dies, the wire bonds, and the folded leads except for the portions of the folded leads forming the lands and the via-shaped array.

12. The semiconductor package of claim 11, wherein the land pad array comprises terminals for connecting the package to an external electronic device.

13. The semiconductor package of claim 11, wherein the via-shaped array comprises terminals for connecting the package to a different semiconductor package stacked thereon.

14. The semiconductor package of claim 11, wherein the back side of the first die is connected to the back side of the second die.

15. The semiconductor package of claim 11, wherein the front of the first die is flip-chipped onto the bottom of substantially flat portion of the longer leads, the back side of the second die is attached to the top of the substantially flat portion of the longer leads, and front side of the second die is connected to the shorter leads by the wire bonds.

16. The semiconductor package of claim 11, wherein the thickness of the folded lead frame ranges from about 600 µm to about 1000 µm.

17. A semiconductor package, comprising:
    a single, folded lead frame having folded leads with an upper portion forming a via-shaped array, a lower portion forming a land pad array, and a die attach pad;
    a first die containing an integrated circuit attached to a first side of die attach pad and connected to the respective folded leads by wire bonds;
    a second die containing an integrated circuit attached to a second side of die attach pad and connected to the respective folded leads by wire bonds; and
    a molding material encapsulating the first and second dies, the wire bonds, and the folded leads except for the portions of the folded leads forming the lands and the via-shaped array.

18. The semiconductor package of claim 17, the folded leads further comprising longer folded leads having a substantially flat portion near the center of the lead frame, an upper portion forming part of the via array, and a lower portion forming part of the land pad array.

19. The semiconductor package of claim 18, the folded leads further comprising shorter folded leads having a lower portion forming part of the land pad array.

20. The semiconductor package of claim 17, wherein the lead frame comprises straight leads which are connected to the die attach pad.

21. The semiconductor package of claim 17, wherein the die attach pad is located near the center of the lead frame.

22. The semiconductor package of claim 21, further comprising a smaller die attach pad located in another part of the package.

23. The semiconductor package of claim 22, further comprising a third die containing a discrete or passive device attached to folded leads located near the smaller die attach pad.

24. The semiconductor package of claim 17, wherein the thickness of the folded lead frame ranges from about 600 μm to about 1000 μm.

* * * * *